(12) United States Patent
Poblenz et al.

(10) Patent No.: US 8,048,225 B2
(45) Date of Patent: Nov. 1, 2011

(54) LARGE-AREA BULK GALLIUM NITRIDE WAFER AND METHOD OF MANUFACTURE

(75) Inventors: Christiane Poblenz, Goleta, CA (US); Mathew C. Schmidt, Goleta, CA (US); Derrick S. Kamber, Goleta, CA (US)

(73) Assignee: Soraa, Inc., Goleta, CA (US)

( * ) Notice: Subject to any disclaimer, the term of this patent is extended or adjusted under 35 U.S.C. 154(b) by 0 days.

(21) Appl. No.: 12/556,562

(22) Filed: Sep. 9, 2009

(65) Prior Publication Data
US 2010/0189981 A1    Jul. 29, 2010

Related U.S. Application Data

(60) Provisional application No. 61/181,513, filed on May 27, 2009, provisional application No. 61/148,361, filed on Jan. 29, 2009.

(51) Int. Cl.
*C30B 21/04* (2006.01)
(52) U.S. Cl. ............. 117/104; 117/86; 117/105; 117/99
(58) Field of Classification Search .................... 117/86, 117/104, 105, 100, 99
See application file for complete search history.

(56) References Cited

U.S. PATENT DOCUMENTS
7,078,731 B2    7/2006    D'Evelyn et al.

OTHER PUBLICATIONS

Cantu et al., "Si Doping Effect on Strain Reduction in Compressively Strained Al0.49Ga0.51N Thin Films" 2003, Applied Physics Letter, vol. 83, No. 4, pp. 674-676.
D'Evelyn et al., "Bulk GaN Crystal Growth by the High-Pressure Ammonothermal Method," Journal of Crystal Growth, 2007, vol. 300, pp. 11-16.
Romanov et al., "Stress Relaxation in Mismatched Layers Due to Threading Dislocation Inclination" 2003, Applied Physics Letter, vol. 83, No. 13, pp. 2569-2571.

*Primary Examiner* — Bob M Kunemund
(74) *Attorney, Agent, or Firm* — Kilpatrick Townsend & Stockton LLP

(57) ABSTRACT

The present invention includes a high-quality, large-area bulk GaN seed crystal for ammonothermal GaN growth and method for fabricating. The seed crystal is of ultra-low defect density, has flat surfaces free of bowing, and is free of foreign substrate material. The seed crystal is useful for producing large-volume, high-quality bulk GaN crystals by ammonothermal growth methods for eventual wafering into large-area GaN substrates for device fabrication.

16 Claims, 17 Drawing Sheets

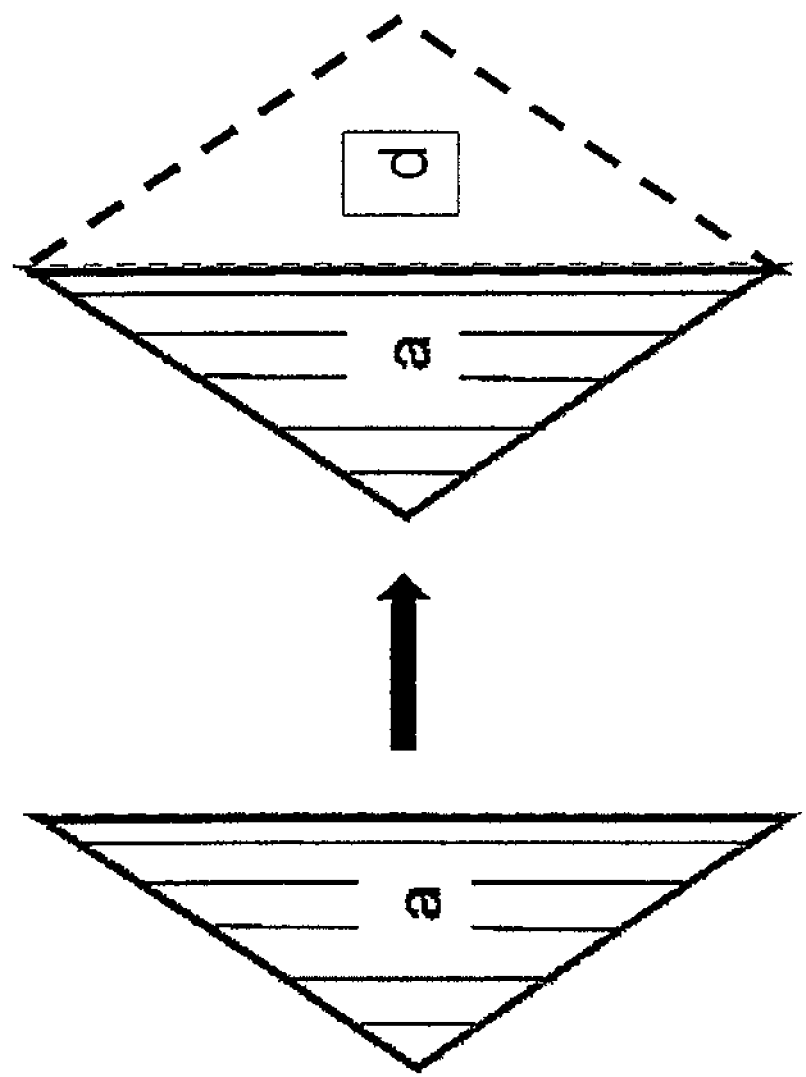

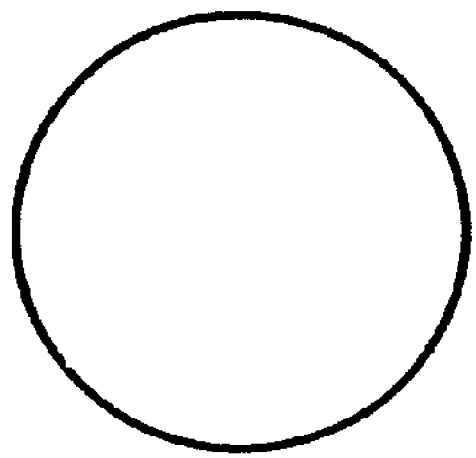
Figure 6(b)
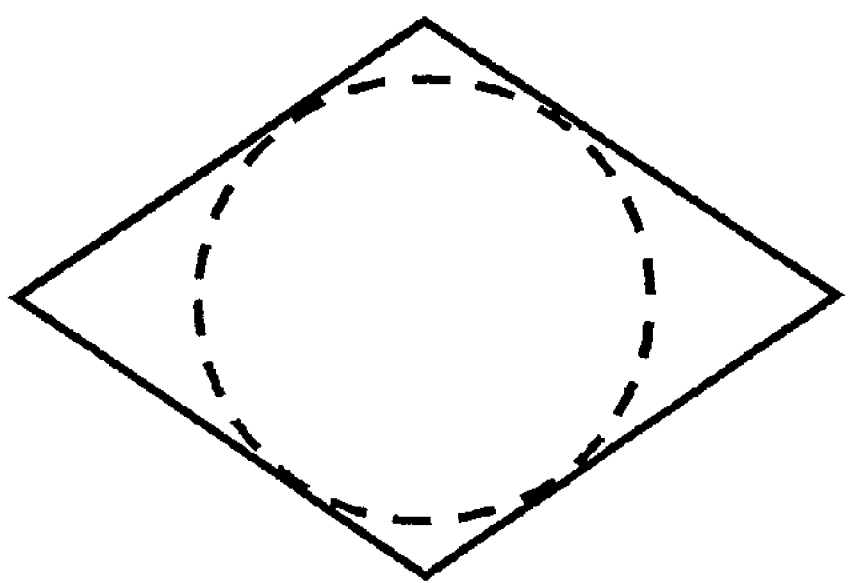
Figure 6(a)

LARGE-AREA BULK GALLIUM NITRIDE WAFER AND METHOD OF MANUFACTURE

CROSS-REFERENCES TO RELATED APPLICATIONS

This application claims priority to U.S. Provisional Application No. 61/148,361 filed Jan. 29, 2009 and U.S. Provisional Application No. 61/181,513 filed May 27, 2009, commonly assigned, both of which are incorporated by reference in their entirety herein.

This application is related to U.S. application Ser. No. 12/556,558, filed Sep. 9, 2009, commonly assigned, of which is incorporated by reference in its entirety herein.

The seed structure described in Poblenz, Christiane, et al., U.S. Provisional Application No. 61/096,304 filed Sep. 9, 2008, commonly assigned, and hereby incorporated by reference herein along with U.S. Provisional Application No. 61/178,460 filed May 14, 2009.

BACKGROUND OF THE INVENTION

The present invention relates generally to crystalline materials. More particularly, the present invention provides an ultra-low defect density, large-area bulk gallium nitride wafer which is free of bowing. The resulting wafer can be used, for example, as a substrate or seed crystal for subsequent growth of crystalline materials, e.g., GaN, AlN, InN, among other applications. The present invention provides a method using a first seed structure which is large-area and free of bowing or other imperfections. The present invention includes lateral growth in one or more embodiments. In a specific embodiment, the resulting large-area bulk gallium nitride wafer can be used in an ammonothermal growth process or the like. In a specific embodiment, the resulting bulk gallium nitride wafer can be used to produce a volume of gallium nitride material which can be cut into a plurality of bulk gallium nitride wafers. Merely by way of example, the present wafer can be used in applications such as light emitting diodes, laser diodes, integrated circuits, MEMS, medical devices, combination of these, among others.

Single-crystal gallium nitride (GaN) containing compounds and related alloy compounds containing aluminum and indium (AlN, $Al_xGa_{1-x}N$, InN, $In_xGa_{1-x}N$) and possibly boron are useful semiconducting materials. Such semiconductor materials can be useful for a variety of applications due to their large bandgap and high chemical and thermal stability. In recent years, there has been significant technological advancement in electronic and optoelectronic devices based on these materials, such as transistors, solar cells, light-emitting diodes, and lasers, among others. Although some of these products are available in the commercial market today, lack of a suitable GaN substrate on which to grow these materials remains a limitation to both performance and providing low cost, volume production of devices.

Conventional approaches to growth of GaN, AlN or InN containing compounds (collectively referred to herein as "(Al,In)GaN" compounds or "(Al,B,In,Ga)N" compounds) and devices employ foreign substrate materials (where "foreign" herein refers to a material containing one or more primary chemical species which is different from Ga, Al, In, or N), a process known as "heteroepitaxy". Heteroepitaxial approaches to growth of (Al,In)GaN containing compounds result in epitaxial films with high defect densities (commonly $10^{10}$ $cm^{-2}$ or higher) due to the large lattice mismatch, chemical dissimilarity and thermal expansion coefficient difference between the nitride materials and substrate. The presence of defects is well-known to be detrimental to device performance. The thermal expansion coefficient difference between the substrate and the epitaxial layer in heteroepitaxy results in strain gradients in the material which can lead to wafer curvature, referred to as bow or warp, after growth. As used herein, the terms bow and warp are used in a manner which is well understood in this art. Definitions, for example, can be found from SEMI (www.semi.org), but others can be commonly known.

Additionally, heteroepitaxy of gallium nitride and related materials on foreign substrates can result in incorporation of impurities into the gallium nitride material. This can be caused by the exposed foreign substrate material being introduced into the growth environment. By varying techniques, the growth environment can involve corrosive gases, high temperatures and pressures, among other process characteristics. Such process characteristics can cause decomposition of the foreign substrate material into its constituent elements, or diffusion of one or more constituent elements into a growing material, or a combination of these effects. For example, common substrates for nitride epitaxy such as sapphire ($Al_2O_3$) and SiC can decompose into their constituent elements Al and O, or Si and C, respectively. These constituent elements can then incorporate into growing nitride materials as impurities and can act as dopants, causing what is known as "unintentional doping" or "UID". There is therefore a need for bulk GaN substrates of high crystalline quality, ideally cut from large volume bulk GaN ingots.

Ammonothermal growth is a promising low cost and potentially highly scalable approach to produce such a GaN ingot. Ammonothermal growth has provided high quality crystalline material, however, drawbacks exist. As an example, ammonothermal growth techniques currently lead to small sized crystals, which are often not useful for commercial applications. Additionally, a significant limitation is that defects in the seed material used for ammonothermal growth are known to replicate on any grown crystal structures. For example, a commonly used method to produce bulk or pseudo-bulk GaN layers is hydride vapor phase epitaxy (also generally known as HVPE). The high growth rates achievable by HVPE allow heteroepitaxy of thick films (on the order of hundreds of microns) on a foreign substrate, resulting in dislocation densities on the order of $10^7$ $cm^{-2}$, for example. GaN layers can be sliced from such HVPE material and subsequently used as a seed for ammonothermal growth, however threading dislocations, strain, and grain or tilt boundaries exist in the HVPE material and will persist in any epitaxial layers subsequently deposited and in any devices fabricated from these layers. These and other limitations often exist with ammonothermal techniques.

From the above, it is seen that techniques for improving crystal growth are highly desired.

BRIEF SUMMARY OF THE INVENTION

According to the present invention, techniques for manufacture of crystalline materials are described. More particularly, the present invention provides a method for forming a high-quality, large-area bulk nitride containing wafer. The term "nitride containing wafer" is used herein to refer to a wafer which in particular contains at least one of a Ga and a N species, an In and a N species, or an Al and a N species. In a specific embodiment, the wafer can be used as a substrate or seed for an ammonothermal growth process or the like. In a specific embodiment, the wafer can be further used to produce large volume bulk gallium nitride crystals which can be cut into wafers for use as substrates. Merely by way of example, the present wafer can be used in applications such as such as light emitting diodes, integrated circuits, MEMS, medical devices, or a combination of these, among others.

In one or more specific embodiments, the present invention provides a bulk nitride containing wafer having a diameter of 1-8 inches which is substantially flat and free of bowing, substantially free of defects, and which does not contain foreign substrate material. The term "foreign substrate" is a term known in the art and used herein to refer to substrate material which contains one or more primary chemical species which is different from Ga, Al, In, or N. Of course, there can be other variations, modifications, and alternatives.

In a specific embodiment, the present invention provides a method for fabricating crystalline material, e.g., gallium nitride (GaN). According to a specific embodiment, the method includes providing a first seed structure fabricated from a method which is described in, for example, "Large-Area Seed for Ammonothermal Growth of Bulk Gallium Nitride and Method of Manufacture," in the name of Poblenz, Christiane et al., listed under U.S. Provisional No. 61/096,304 filed Sep. 11, 2008 and Ser. No. 61/178,460 filed May 14, 2009, commonly assigned, and hereby incorporated by reference herein. Such a seed structure is fabricated utilizing back and front side deposition of nitride-containing crystalline materials on a foreign substrate, and the resultant seed structure is substantially large-area and substantially free of bow or warp. In a specific embodiment, the first seed structure comprises front and back sides which contain one or more GaN layers which are of the c-plane (0001) crystallographic orientation.

The method of the present invention includes providing at least a portion of the first seed structure, and placing the portion of the first seed structure into a processing chamber. In a specific embodiment, lateral overgrowth is performed and the nearly defect-free laterally grown regions are separated from the first seed structure to result in bulk gallium nitride containing material which is substantially defect free, substantially free of bowing, and does not contain foreign substrate material. In a specific embodiment, one or more of these steps are repeated to result in a large-area bulk nitride containing wafer, e.g. gallium nitride, which is substantially defect free, substantially free of bowing, and does not contain foreign substrate material. As used herein, the terms "lateral overgrowth", "lateral growth", or other deviations of these terms, can generally mean lateral growth, including growth both over an object and growth that is not directly over an object, or even undergrowth, as well as other interpretations commonly known by one of ordinary skill in the art.

In an alternative specific embodiment, the present invention provides a method for fabricating crystalline material. The method includes providing a seed structure having a first surface and a second surface. In a specific embodiment, the first surface and the second surface are composed of at least a GaN material. The first surface is overlying one side of an intermediary substrate and the second surface is overlying another side of the intermediary substrate to form a composite structure, which is substantially free from bowing. In a preferred embodiment, the intermediary substrate is characterized by a diameter of at least two inches in diameter, but can be larger. In a specific embodiment, the present invention provides a method for separating a composite region from the composite structure exposing one or more portions of the intermediary substrate and forming a first portion of the first surface and a second portion of the second surface. The method includes optionally forming an isolation region overlying the exposed one or more portions of the intermediary substrate to isolate the intermediary substrate from an exterior region and forming a first thickness of first crystalline material overlying the first portion of the first surface and a second thickness of the crystalline material overlying the second portion of the second surface. In a specific embodiment, the first thickness of the first crystalline material and the second thickness of the second crystalline material are characterized by a first dislocation density. In a preferred embodiment, the method includes causing formation of a first lateral growth region from the first thickness and a second lateral growth region from the second thickness. Preferably, the first lateral growth region and the second lateral growth region are characterized by a second dislocation density, which is less than the first dislocation density. The method also includes removing at least one seed crystal from one or more portions of at least the first lateral growth region or the second lateral growth region. The seed crystal is characterized by the second dislocation density.

In yet an alternative specific embodiment, the present invention provides a bulk GaN substrate comprising a gallium nitride crystal material having a dislocation density of less than $10^4$ defects/centimeter$^2$ and a diameter of at least two inches, or the diameter can be slightly smaller but preferably larger. As used herein, the term "GaN" substrate refers to any suitable substrate having gallium and nitrogen species or other interpretations commonly known by one of ordinary skill in the art. Of course, the can be other variations, modifications, and alternatives.

One or more benefits may be achieved using one or more of the specific embodiments. As an example, the present device and method provides a substantially flat and large area seed crystal having high quality and low defect density, suitable for ammonothermal growth or growth by another bulk growth process, including but not limited to solution growth, high pressure solution growth, liquid phase epitaxy, physical vapor transport, and melt growth. In a specific embodiment, the present method and device can be made using conventional techniques and is cost effective. In a specific embodiment, the present wafer provides a cost-effective route to high-quality large-area bulk GaN substrates which are currently of very limited availability. In a specific embodiment, the present wafer can be used for ammonothermal growth of a volume of gallium nitride which can be subsequently cut into wafers of suitable size and quality for use as substrates. In a preferred embodiment, the present method and device provide for high quality, low-defect, large-area bulk gallium nitride substrates to enable performance enhancements in gallium nitride-based electronic and optoelectronic devices which have a variety of growing commercial applications. The present invention provides such a high-quality large-area gallium nitride wafer in one or more embodiments. Depending upon the embodiment, one or more of these benefits can be achieved. These and other benefits are further described throughout the present specification and more particularly below.

The present invention achieves these benefits and others in the context of known process technology. However, a further understanding of the nature and advantages of the present invention may be realized by reference to the latter portions of the specification and attached drawings.

BRIEF DESCRIPTION OF THE DRAWINGS

FIG. 5(a) is a simplified diagram of the top-down view of a second seed crystal which comprises region "a" of the crystalline material shown in FIG. 4 after separation;

FIG. 5(b) is a simplified diagram of the top-down view of the large-area bulk nitride containing wafer resulting from growth on the second seed comprising region "a". A new region "d" results from lateral growth which in a specific embodiment has substantially symmetrical shape relative to region "a". According to a preferred embodiment of the present invention, the large-area bulk nitride containing wafer shown in FIG. 5b is substantially free of bowing and defects;

FIG. 6(a) is a simplified diagram of the top-down view of the resulting large-area bulk GaN wafer with dashed lines indicating where re-shaping could occur to result in a circular wafer with maximum area, according to a specific embodiment;

FIG. 6(b) is a simplified diagram of the top-down view of a re-shaped bulk GaN wafer which is circular in shape according to a specific embodiment;

DETAILED DESCRIPTION OF THE INVENTION

Figure 1B:
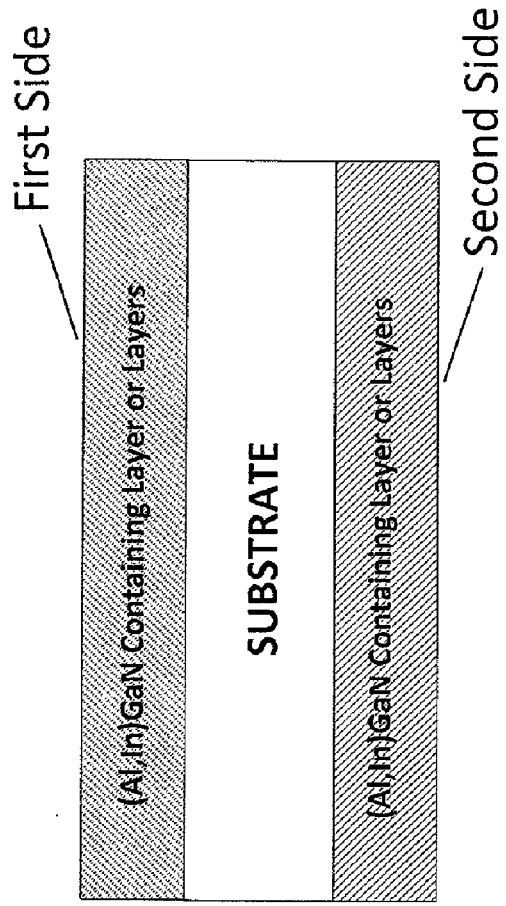
FIG. 1(b) is a simplified diagram of a cross-section of the first seed structure. The first seed structure comprises a first side, a second side, and a crystalline substrate material. According to a specific embodiment, the first side and second side contain at least one of Ga and N, In and N, or Al and N, and the crystalline substrate material is foreign (i.e. contains one or more primary chemical species which is different from Ga, Al, In, or N))

According to the present invention, techniques for manufacture of crystalline materials are provided. More particularly, the present invention provides a large-area bulk gallium nitride wafer and method of manufacture. In a specific embodiment, the bulk gallium nitride wafer can be used in an ammonothermal growth process or the like. In a specific embodiment, the wafer can be further used to produce large-volume bulk gallium nitride crystals which can be cut into wafers for use as substrates. Merely by way of example, the present wafer can be used in applications such as such as light emitting diodes, integrated circuits, MEMS, medical devices, combination of these, among others.

According to specific embodiment of the present invention, techniques are provided for manufacture of a bulk gallium nitride wafer which is large-area, substantially free of bowing, substantially defect-free, and free of foreign substrate materials. Such a wafer can be used, for example, as a seed for ammonothermal growth of gallium nitride and related materials. The large area and high quality (substantial lack of bowing and defects) of the wafer produced by the method described herein will provide for subsequent high quality bulk growth (by ammonothermal methods or the like) which can be cut into wafers to be used as substrates. Material produced from the preferred method described herein will be substantially free of impurity incorporation from foreign substrate materials and when further used as a seed to produce substrates, removal of foreign substrate material will not be required.

According to a specific embodiment, the wafer provided by the present invention comprises bulk gallium nitride (GaN) crystalline material. In other embodiments, the present wafer contains substantially at least one of Ga and N, In and N, or Al and N. In a specific embodiment, the method for producing such a bulk gallium nitride wafer includes utilizing at least a portion of a first seed structure. Such a first seed structure is obtained through double-sided deposition on both sides of a foreign substrate with substantially similar thicknesses, coefficients of thermal expansion, and/or lattice constants of gallium nitride or like material such that strain is balanced and the resulting seed crystal is substantially free of bow or warp. In a specific embodiment of the present invention, lateral growth or overgrowth is performed on at least a portion of the first seed structure. In a specific embodiment lateral growth or overgrowth regions which are nearly defect-free are separated from the first seed structure, and optionally one or more subsequent lateral growth or overgrowth steps are performed to result in a nearly defect-free, bow-free, large-area bulk nitride containing wafer which does not contain foreign substrate material.

Additionally as background to the present invention, we discovered that the resulting crystalline quality using ammonothermal growth depends directly on having a high quality GaN seed crystal for growth. We also believe that the seed is preferably large-area in order to accommodate eventual wafering into large-area substrates for device fabrication. Additionally, seed crystals of GaN for ammonothermal growth can be obtained in various ways. As low dislocation densities are desired, one approach to producing thick GaN layers or bulk GaN (via substrate removal after heteroepitaxial growth) for ammonothermal seed is by hydride vapor phase epitaxy (HVPE). However, HVPE films commonly contain dislocation densities on the order of $\sim 10^{10}$ cm$^{-2}$ at the onset of growth. These can drop by several orders of magnitude (to $\sim 10^7$ cm$^{-2}$) after hundreds of microns of growth, however, grain and tilt boundaries may be present and surfaces can be faceted. In addition, thermal mismatch between the HVPE-grown layer and the substrate induces strain gradients in the material which result in bowing upon cool down. Additionally, inclination of threading dislocations can result in strain gradients. (See for example, A. E. Romanov and J. S. Speck, Appl. Phys. Lett. 83, 2569 (2003), and P. Cantu, F. Wu, P. Waltereit, S. Keller, A. E. Romanov, U. K. Mishra, S. P. DenBaars, and J. S. Spec, Appl. Phys. Lett. 83, 674 (2003)) Bowing persists in the HVPE-GaN seed crystal even after subsequent substrate removal (most notably from strain gradients due to threading dislocation inclination), and thus, would persist in ammonothermally grown GaN if this material is used as a seed.

Additionally, the seed structure described in Poblenz, Christiane et. al., U.S. Provisional No. 61/096,304, filed Sep. 11, 2008, commonly assigned, and hereby incorporated by reference herein, could be used for ammonothermal growth, however, it contains foreign substrate material sandwiched between layers of nitride containing material. The foreign substrate material is a potential source of contamination and/or impurity incorporation in subsequent growth environments, e.g. ammonothermal. The presence of the foreign substrate material could also complicate separation of a volume of nitride containing material, e.g., gallium nitride, into wafers for use as substrates. Furthermore the defect densities in such a wafer are limited to what can be achieved through heteroepitaxy. The presence of defects is well-known in the field to hinder device performance. These and other limitations are overcome by one or more of the techniques described throughout the present specification and more particularly below.

Figure 1A:
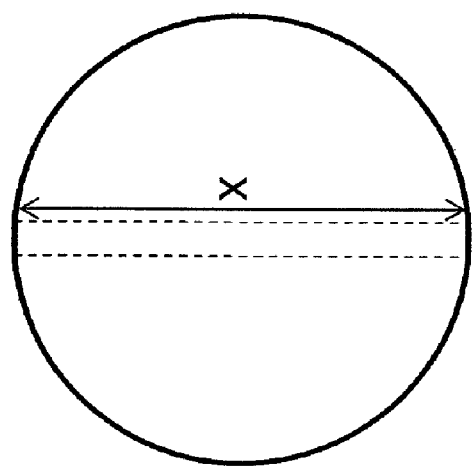
FIG. 1 (a) is a simplified diagram of a top-down view of a first side of a first seed structure which is substantially free of bowing, according to a specific embodiment of the present invention. Dashed lines indicate a portion of the seed structure with a maximum lateral dimension (x) substantially close to the maximum lateral dimension of the seed structure, according to a preferred embodiment of the present invention.

In a specific embodiment as referred to in the Figures, the present invention includes a method for fabricating a high-quality large-area bulk gallium nitride wafer according to the following steps:

1. Begin;
2. Provide a first seed structure which is substantially free of bow or warp, the first seed structure having a first and second side each of which contain at least one of Ga and N, In and N, or Al and N, and containing a foreign crystalline substrate material, see FIG. 1(a) and FIG. 1(b);
3. Separate at least a portion of the first seed structure. According to a specific embodiment of the present invention, the portion of the seed structure having a maximum lateral dimension (x) substantially similar to the maximum lateral dimension of the first seed structure and a second dimension y where x>>y, see FIG. 2;
4. Preferably, prepare (e.g. clean, degrease) the portion of the first seed structure for a growth technique for nitride materials containing at least one of Ga and N, In and N, or Al and N;
5. Preferably, coat sidewalls of the first seed structure to isolate exposed crystalline substrate material from the external environment;
6. Transfer the prepared portion of the first seed structure into a growth chamber, e.g., a growth chamber suitable for ammonothermal growth;
7. Deposit (under desired thermal conditions) a nitride layer containing at least one of Ga and N, In and N, or Al and N, overlying the portion of the first seed structure, using a nitride growth technique (e.g. ammonothermal), see FIG. 3;
8. Cool the portion of the first seed structure and overlying material and remove resulting crystalline material from growth chamber;
9. Separate the resulting crystalline material into two or more distinct pieces of crystalline material, in a specific embodiment at least two of the pieces containing only laterally overgrown or laterally grown bulk nitride material, see FIG. 4; and
10. Repeat and/or perform other steps as desired.

The above sequence of steps provides a fabrication method for forming a large-area bulk gallium nitride containing wafer according to an embodiment of the present invention, and is more particularly detailed below. In a specific embodiment, the present invention provides a method and device for forming a large-area bulk wafer containing at least one of Ga and N, In and N, or Al and N using a first seed structure which is substantially free of bowing. Other alternatives can also be provided where steps are added, one or more steps are removed, or one or more steps are provided in a different sequence without departing from the scope of the claims herein. Of course, there can be other variations, modifications, and alternatives.

In another specific embodiment as referred to in the Figures, the present invention includes a method for fabricating a high-quality large-area bulk gallium nitride wafer according to the following steps:

1. Begin;
2. Provide a first seed structure which is substantially free of bow or warp, the first seed structure having a first and second side each of which contain at least one of Ga and N, In and N, or Al and N, and containing a foreign crystalline substrate material, see FIG. 1(a) and FIG. 1(b);
3. Separate at least a portion of the first seed structure. According to a specific embodiment of the present invention, the portion of the seed structure having a maximum lateral dimension (x) substantially similar to the maximum lateral dimension of the first seed structure and a second dimension y where x>>y, see FIG. 2;
4. Preferably, prepare (e.g. clean, degrease) the portion of the first seed structure for a growth technique for nitride materials containing at least one of Ga and N, In and N, or Al and N;
5. Preferably, coat sidewalls of the first seed structure to isolate exposed crystalline substrate material from the external environment;
6. Transfer the prepared portion of the first seed structure into a growth chamber, e.g., a growth chamber suitable for ammonothermal growth;
7. Deposit (under desired thermal conditions) a nitride layer containing at least one of Ga and N, In and N, or Al and N, overlying the portion of the first seed structure, using a nitride growth technique (e.g. ammonothermal), see FIG. 3;
8. Cool the portion of the first seed structure and overlying material and remove resulting crystalline material from growth chamber;
9. Separate the resulting crystalline material into two or more distinct pieces of crystalline material, in a specific embodiment at least two of the pieces containing only laterally overgrown or laterally grown bulk nitride material, see FIG. 4;
10. Provide one of the distinct pieces of crystalline material, in a specific embodiment a piece which contains primarily laterally overgrown or laterally grown bulk nitride material, as a second seed crystal, see FIG. 5(a);
11. Preferably, prepare (e.g. clean, degrease) the second seed crystal for a growth technique for nitride materials containing at least one of Ga and N, In and N, or Al and N;
12. Transfer the prepared second seed crystal into a growth chamber, e.g., a growth chamber suitable for ammonothermal growth;
13. Deposit (under desired thermal conditions) a nitride layer containing at least one of Ga and N, In and N, or Al and N, overlying the second seed crystal, using a nitride growth technique (e.g. ammonothermal) and resulting in a larger-area bulk nitride containing wafer, see FIG. 5(b);
14. Cool the second seed crystal and overlying material and remove resulting large-area bulk nitride containing wafer from growth chamber;
15. Optionally, re-shape resulting bulk nitride containing wafer, e.g. to approximately circular dimensions, see FIG. 6(a) and FIG. 6(b);
16. Optionally, prepare re-shaped bulk nitride containing wafer (e.g. clean, degrease) for a growth technique for nitride materials;
17. Optionally, transfer re-shaped bulk nitride containing wafer into a growth chamber, e.g. a growth chamber suitable for ammonothermal growth;
18. Optionally, deposit (under desired thermal conditions) a nitride layer containing at least one of Ga and N, In and N, or Al and N, overlying the bulk nitride containing wafer, using a nitride growth technique (e.g. ammonothermal), resulting in a volume of bulk gallium nitride containing crystalline material;
19. Optionally, cut resulting volume of bulk gallium nitride containing crystalline material cross-sectionally to result in multiple wafers which can be used as substrates; and
20. Repeat and/or perform other steps as desired.

The above sequence of steps provides a fabrication method for forming a large-area bulk gallium nitride containing wafer according to an embodiment of the present invention, and is more particularly detailed below. In a specific embodiment, the present invention provides a method and device for forming a large-area bulk wafer containing at least one of Ga and N, In and N, or Al and N using a first seed structure which is substantially free of bowing. Other alternatives can also be provided where steps are added, one or more steps are removed, or one or more steps are provided in a different sequence without departing from the scope of the claims herein. Of course, there can be other variations, modifications, and alternatives.

In a specific embodiment, the foreign substrate used in fabrication of the first seed structure is sapphire. Sapphire substrates are commonly available with diameters of 2"-8" and are well-known to be suitable for deposition of high-quality gallium nitride containing layers. In a specific embodiment the deposition technique used for fabrication of the first seed structure is metal-organic chemical vapor deposition (MOCVD), which is a conventional technique well-known in the art for deposition of nitride containing materials, e.g. gallium nitride. In preferred embodiments of the present invention, the first seed structure therefore has a diameter of 2" or greater, or a dimension of 2" or greater since the seed structure does not have to have a round geometry. A depiction of such a first seed structure is shown in FIG. 1. Use of such a first seed structure is desired due to the lack of bowing in the seed crystal.

In a specific embodiment of the present invention, the first and second sides of the first seed structure substantially comprise GaN crystalline material. In other embodiments, the first and second sides of the first seed structure comprise crystalline material which contains at least one of Ga and N, In and N, or Al and N. Throughout this document when the term "GaN" or one of its derivatives is used, it is understood that this refers to all crystalline material containing one of Ga and N, In and N, or Al and N. In a specific embodiment, the GaN crystalline material has a wurtzite crystal structure. In a preferred embodiment, the GaN crystalline material on both the first and second sides of the first seed structure has an (0001) or (000-1) c-plane crystallographic orientation. Such orientations will allow subsequent lateral growth to occur in the perpendicular <10-10> m-direction or <11-20> a-direction or a combination thereof.

It can be known from literature and previously taught by D'Evelyn et al. (See for example, M. P. D'Evelyn, H. C. Hong, D.-S. Park, H. Lu, E. Kaminsky, R. R. Melkote, P. Perlin, M. Lesczynski, S. Porowski, R. J. Molnar, "Bulk GaN crystal growth by the high-pressure ammonothermal method", Journal of Crystal Growth 300, 11-16 (2007), and D'Evelyn et al. U.S. Pat. No. 7,078,731 "Gallium nitride crystals and wafers and method of making" Jul. 18, 2006) that for ammonothermal growth, for example, growth of a (0001) c-plane seed crystal will have dramatically lower dislocation density in the laterally grown regions in <11-20> or <10-10> directions. It can be shown that dislocation densities in the ammonothermally grown GaN containing crystalline material will approximately replicate that of the underlying c-plane seed crystal in the (0001) direction. Starting dislocation densities for example are in the $10^8$-$10^{10}$ cm$^{-2}$ range for (0001) GaN seed crystals grown by hydride vapor phase epitaxy or metal-organic chemical vapor deposition. While some dislocation reduction is known to occur with increasing thickness of material, dislocation densities can remain, for example, in the $10^6$-$10^7$ cm$^{-2}$ range in subsequent (0001) GaN overgrowth by ammonothermal methods. In contrast, the ammonothermal lateral growth regions in the <11-20> or <10-10> directions can have substantially lower dislocation densities, for example less than 100 cm$^2$.

Figure 3:
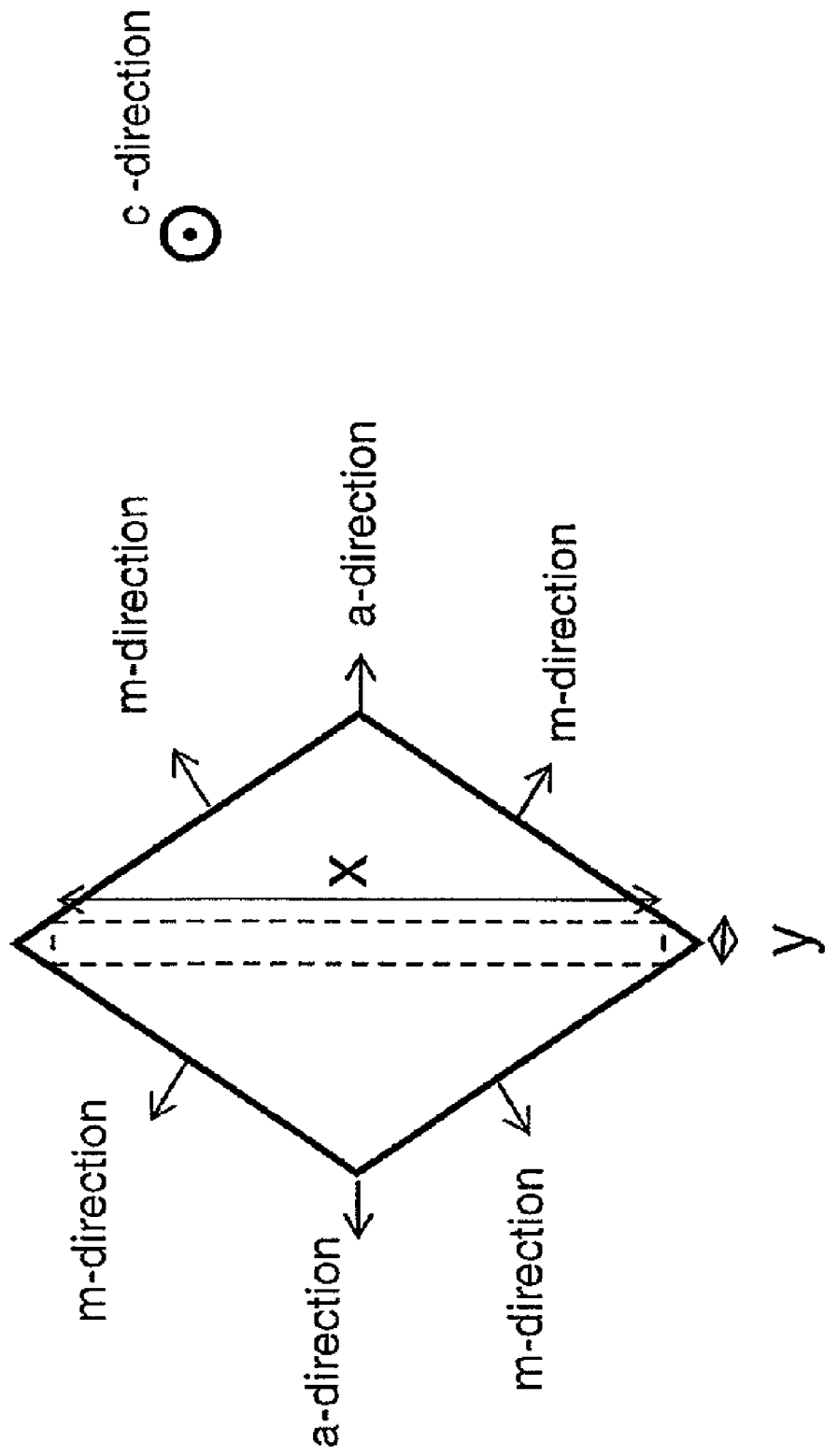
FIG. 3 is a simplified diagram of a top-down view of crystalline material after lateral overgrowth has been performed over the portion of the first seed structure shown in FIG. 2. The resultant shape of the crystalline material is outlined with solid lines and the location of the underlying portion of the first seed structure is indicated with dashed lines. The maximum lateral dimension of the resultant crystalline material is substantially close to the maximum lateral dimension of the portion of the first seed structure (x), according to a preferred embodiment of the present invention. The resultant shape of the crystal is approximately a rhombus with edges comprising m-planes of GaN, according to a specific embodiment.
Figure 3A:
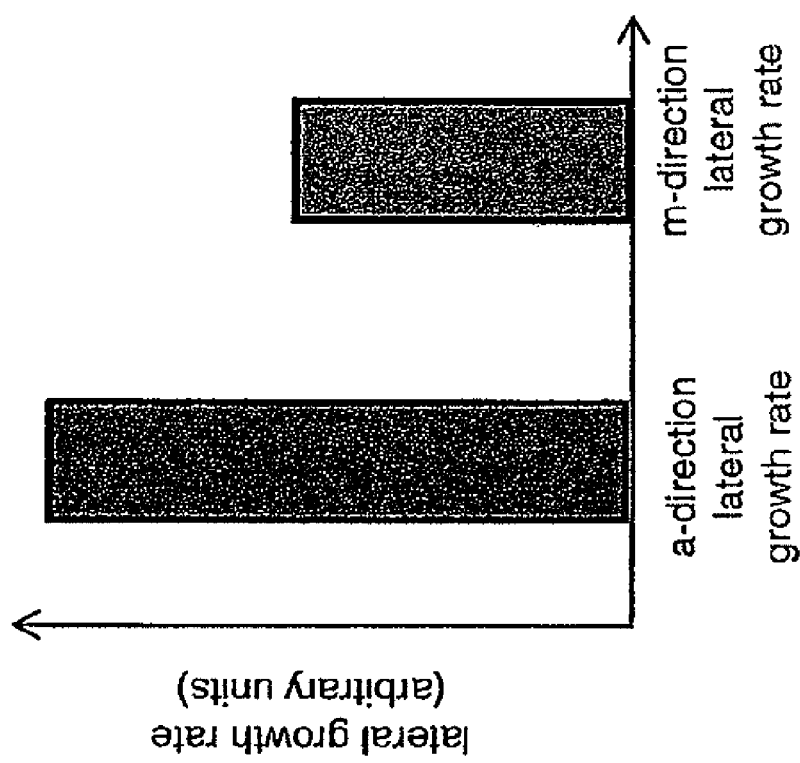
FIG. 3(a) is a simplified diagram illustrating lateral growth rate according to an embodiment of the present invention.

Additionally it can be known from literature and previously taught by D'Evelyn et al. (See for example, M. P. D'Evelyn, H. C. Hong, D.-S. Park, H. Lu, E. Kaminsky, R. R. Melkote, P. Perlin, M. Lesczynski, S. Porowski, R. J. Molnar, "Bulk GaN crystal growth by the high-pressure ammonothermal method", Journal of Crystal Growth 300, 11-16 (2007), and D'Evelyn et al. U.S. Pat. No. 7,078,731 "Gallium nitride crystals and wafers and method of making" Jul. 18, 2006) [3-4], that the relative growth rates of GaN in the c-, a- and m-directions can vary depending upon the growth conditions. It has been shown that under appropriate growth conditions, lateral a-direction growth rates can exceed that of the m-direction, as depicted in FIG. 3(a). Therefore, lateral growth of a c-plane crystal can consist of predominant growth in the a-direction which will eventually terminate in m-planes, as shown in FIG. 3. As the lateral growth regions are nearly defect-free, and for other reasons previously described herein, these are the desired regions to utilize as seed crystals for subsequent growth steps according to one or more embodiments of the present invention. Also as previously discussed, it is desired that the wafer formulated by the methods described herein be large-area, according to a preferred embodiment of the present invention. Therefore, the area of the lateral growth region or regions must be maximized. This can be achieved in one or more embodiments of the present invention with appropriate choice of a seed crystal or seed structure shape.

Figure 2A:
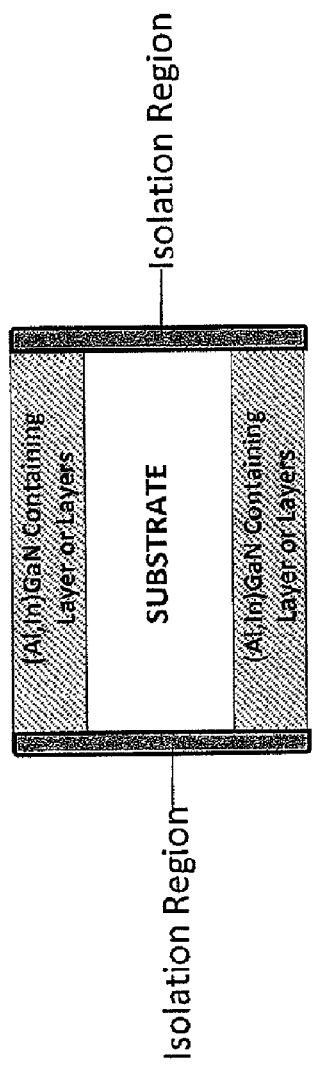
FIG. 2(a) is a simplified diagram of a cross-sectional view of a portion of the first seed structure after an isolation region has been formed according to an embodiment of the present invention.
Figure 2:
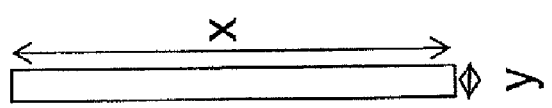
FIG. 2 is a simplified diagram of a top-down view of a portion of the first seed structure, with a maximum lateral dimension (x) substantially close to the maximum lateral dimension of the first seed structure, and a corresponding perpendicular dimension y with x>>y, according to a preferred embodiment of the present invention.

To achieve a large-area bulk gallium nitride wafer according to the method of the present invention, it is therefore desired that the first seed structure have a substantially large maximum lateral dimension. In a specific embodiment the maximum lateral dimension is 2" or greater. This will enable the maximum area of laterally grown material in a subsequent growth step or steps. Additionally, it is desired to minimize the total area of the first seed structure according to a specific embodiment of the present invention. This is important in the case of a c-plane seed crystal or seed structure, for example, as the overgrowth in the c-direction will have high threading dislocation densities and therefore be less desirable for use as a subsequent seed crystal. Therefore, a rectangle is the preferred shape of the first seed structure, in which the maximum lateral dimension, x, is substantially larger than the corresponding perpendicular dimension, y, as shown in FIG. 2.

In a specific embodiment, the desired shape of the first seed structure can be achieved by separating a portion of the first seed structure by dicing methods. In other embodiments the separation can be achieved by methods including, but not limited to, dicing, diamond scribing, laser scribing, breaking, cleaving, or a combination of these, among others. A large maximum lateral dimension (x) can be achieved according to a specific embodiment of the present invention by utilizing a first seed structure which is approximately circular with a substantially large diameter. In a specific embodiment, the first seed structure has a diameter of 8". In other embodiments, the first seed structure has a diameter of 6", 4" or 2". Subsequently, a portion of the seed structure in the desired shape can be separated from the central region of the circular first seed structure such that the maximum lateral dimension (x) is substantially close to the diameter of the seed structure (FIGS. 1 and 2). According to a specific embodiment of the present invention, this dimension is maximized by utilizing a first seed structure fabricated on sapphire which is commonly available in circular wafers with diameters ranging from 2"-8", for example.

In a specific embodiment, the desired shape of the first seed structure can be achieved by masking or covering specific regions of the substrate. A mask can be applied to the undesired regions of the initial seed structure to produce an exposed seed structure possessing the maximum lateral dimensions (x) as described previously. For example, a 2 inch diameter seed structure could be completely covered with a masking material except for a rectangular section with a long lateral dimension and a substantially smaller perpendicular dimension. Examples of masking materials include platinum, gold, silver, nickel, chromium, iridium, vanadium, along with other materials or a combination thereof. According to a specific embodiment of the present invention, the lateral dimension is maximized by utilizing a first seed structure fabricated on sapphire which is commonly available in circular wafers with diameters ranging from 2"-8", for example.

In a specific embodiment of the present invention, lateral growth from a portion of the first seed structure with the desired rectangular shape gives rise to an approximate rhombus crystal shape which is depicted in FIG. 3. In a preferred embodiment the lateral growth is performed utilizing ammonothermal growth under appropriate conditions which allow the a-directions to grow preferentially. In the resultant crystal shown in FIG. 3, the edges of the rhombus therefore substantially comprise m-plane orientations according to a specific embodiment.

Figure 4B:
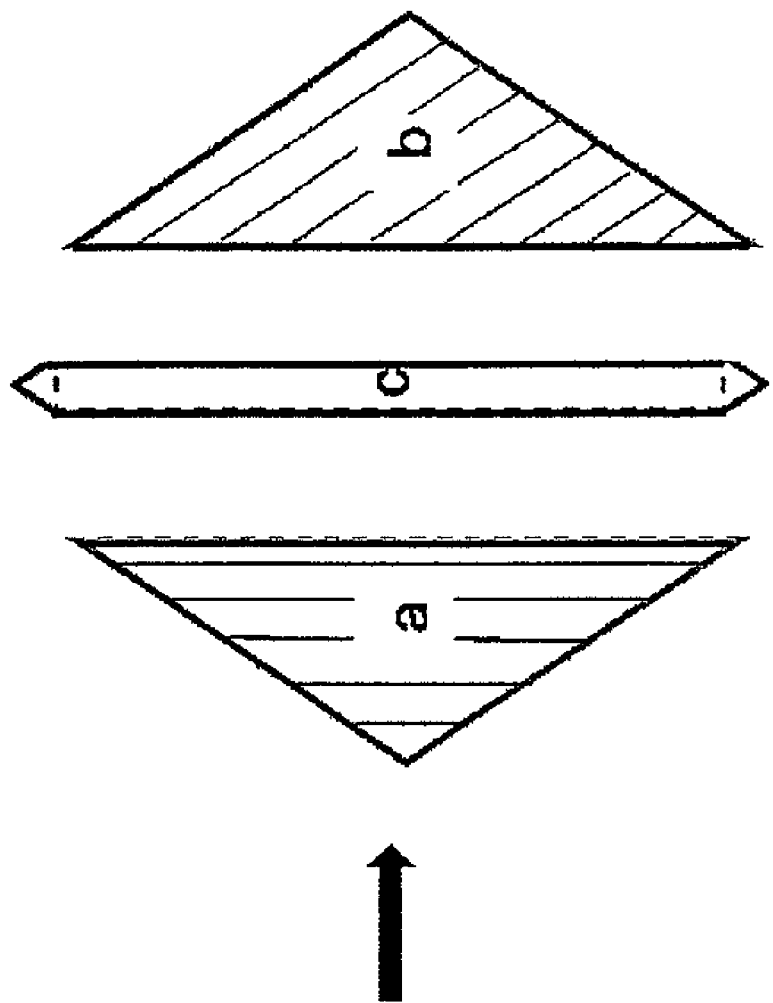
FIG. 4(b) is a simplified diagram of three distinct regions, "a", "b", and "c", of the resultant crystalline material after separation, according to a specific embodiment of the present invention. According to a preferred embodiment of the present invention regions "a" and "b" are substantially defect free and do not contain foreign substrate material.
Figure 4A:
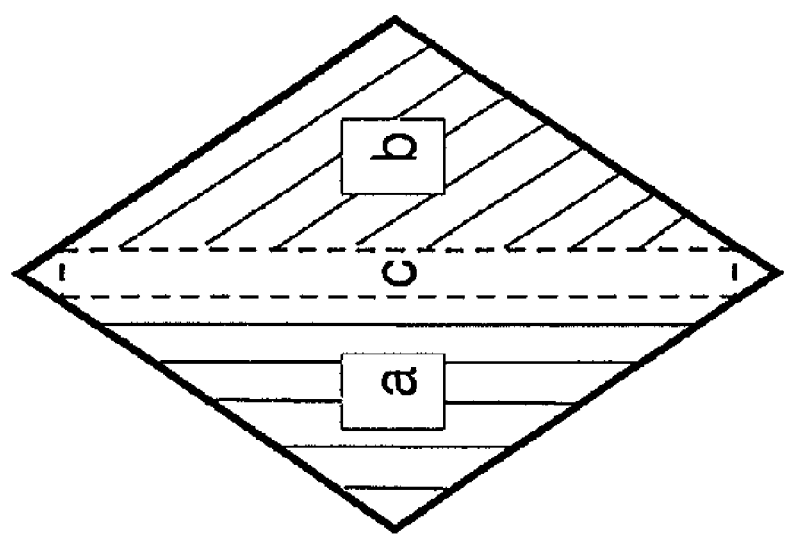
FIG. 4(a) is a simplified diagram of a top-down view of crystalline material after lateral growth has been performed over the portion of the first seed structure shown in FIG. 2, the resultant crystalline material comprising three regions "a", "b" and "c". Regions "a" and "b" comprise laterally grown material and region "c" comprises material grown over the portion of the first seed structure.

Subsequent removal of at least a portion of the nearly defect-free lateral growth regions is desired according to the method presented herein, as shown in FIG. 4a and FIG. 4b. In a specific embodiment, one region "a", "b", or "c" is then utilized as a second seed for subsequent crystal growth. In a specific embodiment, separation of the material into one or more distinct regions occurs by dicing. In other embodiments separation can occur by methods including, but not limited to, dicing, diamond scribing, laser scribing, breaking, cleaving, or a combination of these, among others. In preferred embodiments at least a portion of region "a" or region "b" is used. These regions are desired according to one or more specific embodiments because they comprise material which is substantially free of defects and bowing and, after separation, does not contain foreign substrate material. This is shown by example in FIG. 5a.

Subsequently, according to a specific embodiment, a second lateral growth step is performed using a second seed crystal defined above. According to a preferred embodiment, this second growth step is done utilizing ammonothermal growth techniques in the same manner and under substantially the same growth conditions as the first lateral growth step, although different growth techniques and/or growth conditions can be used. This can result again in the rhombus crystal shape in which the edges of the crystal substantially comprise m-planes, as shown in FIG. 5b. At this step of the process, a nearly defect-free, bow-free bulk GaN containing wafer has been fabricated which comprises a substantially large area. In other embodiments, this process can be repeated for one or more subsequent seed crystals obtained from the first seed structure in the manner described. In a specific embodiment the resulting wafer has a dislocation density of $<10^4$ cm$^{-2}$.

Figure 3B:
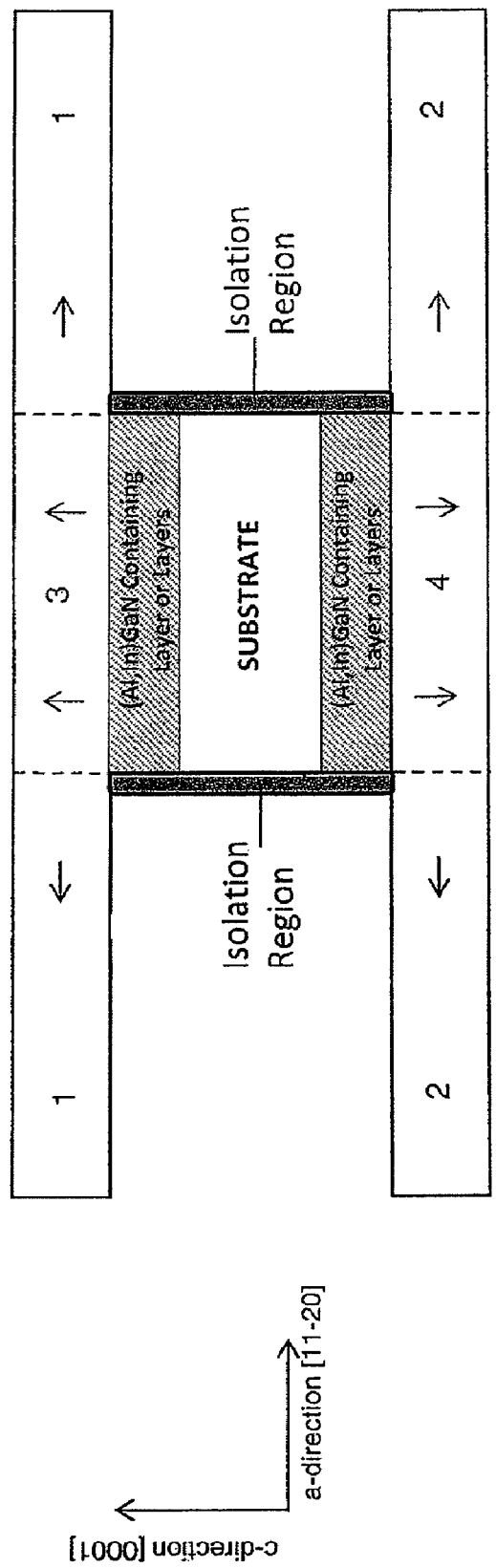
FIG. 3(b) is a simplified diagram illustrating a cross-sectional view of a portion of the first seed structure according to an embodiment of the present invention.
Figure 3C:
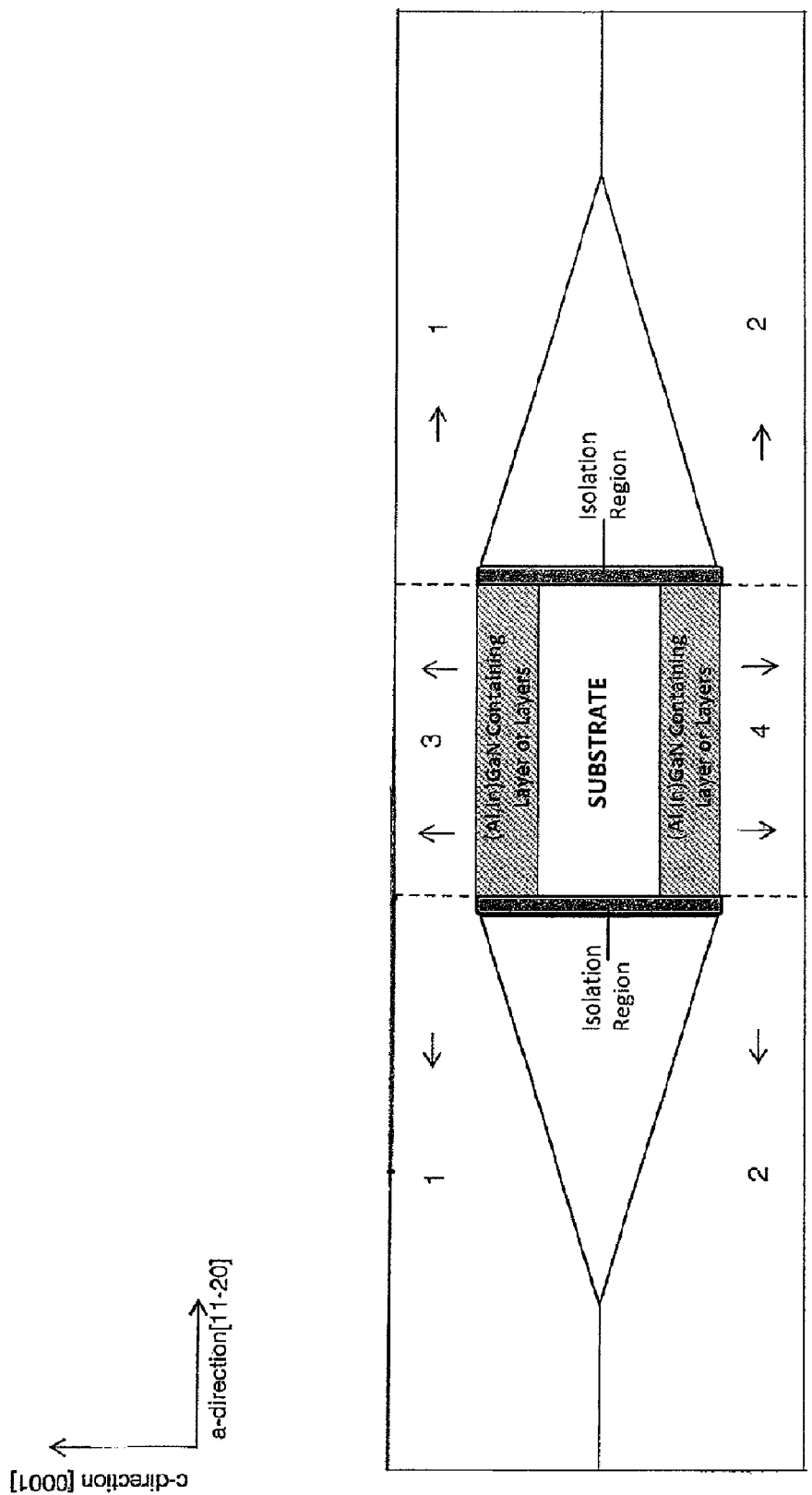
FIG. 3(c) is a simplified diagram illustrating a cross-sectional view of a portion of the first seed structure according to an alternative embodiment of the present invention.

In a specific embodiment, the lateral growth steps occur in an ammonothermal growth environment and therefore the growth can proceed concurrently on both the front and back sides of the seed structure or seed crystal. This is depicted in a simplified diagram in FIG. 3(b). The lateral growth regions 1 and 2 can be referred to as "wing" regions. In one or more embodiments, depending on growth conditions and times, the wing regions can grow to attach or coalesce as shown in FIG. 3(c). In a specific embodiment, growth can occur off of one side of the seed structure or seed crystal. This can be accomplished by depositing a masking material on the opposite (non-growth) face to prevent growth. Masking materials may include platinum, gold, silver, nickel, chromium, iridium, vanadium, along with other materials or a combination thereof. Growth off of one surface may also be accomplished by preventing the exposure of one side of the seed structure to the growth environment, for example, by mating it against a surface within the growth environment. Growth may also optionally occur off of the sidewalls of the seed structure, depending on whether or not an encapsulate or mask is deposited on the seed structure sidewalls. In a specific embodiment, the lateral growth or "wing" regions may be used as seed crystals for subsequent growth. In another specific embodiment, the lateral growth or "wing" regions may be used as seed crystals for subsequent growth, wherein growth may proceed off of the sidewalls of the laterally grown seed to produce additional lateral growth regions. This may be accomplished by utilizing masking materials, such as platinum, gold, silver, nickel, chromium, iridium, vanadium, along with other materials or a combination thereof, where the mask is deposited on surfaces of the initial lateral growth or "wing" region where growth is undesired. In a specific embodiment, growth may occur off of one or more of the exposed sidewalls of the (Al,B,In,Ga)N containing layers comprising the double-sided seed structure. In one or more embodiments, the lateral growth regions are substantially defect free. In a specific embodiment, the lateral growth regions have defect densities of <$10^4$ cm$^{-2}$. In a specific embodiment, the lateral growth regions are substantially free of strain gradients and substantially free of bow or warp.

In a specific embodiment, the resulting large-area bulk GaN wafer can be utilized for one or more subsequent growth steps with the goal of producing a volume of GaN such as an ingot or boule. In a specific embodiment, such an ingot or boule is grown in the c-plane orientation. The large-area bulk GaN wafer resulting from the method provided herein can have surfaces terminated by slower growth planes which, in a specific embodiment, may be inclined with respect to the c-plane. The presence of such inclined plane surfaces is therefore undesirable for subsequent growth steps in which the goal is a predominantly c-plane oriented boule or ingot. To address this issue, the large-area bulk GaN wafer can be sliced to expose a substantially flat large-area c-plane surface for subsequent growth processes.

If the large-area bulk GaN wafer is used to produce a boule or ingot of GaN, the boule or ingot can be subsequently sliced to provide a plurality of wafers for use as substrates. The boule or ingot can be sliced in various orientations to result in wafers which have c-plane, nonpolar or semipolar crystallographic orientations. In a specific embodiment the wafers have a c-plane crystallographic orientation which is within approximately 10 degrees of (0001) or (000-1).

Crystallographic orientations which are approximately 90 degrees to (0001) or (000-1) are known as nonpolar orientations. Two prominent families of nonpolar planes for wurtzite nitride containing materials are {10-10}, known collectively as m-planes, or {11-20}, known collectively as a-planes. In a specific embodiment of the present invention, wafers created from the large-area bulk GaN wafer and subsequent growth have an orientation within 10 degrees of {10-10} or {11-20}.

Crystallographic orientations which are oriented at angles between 0 and 90 degrees of or [000-1] are known as semipolar orientations of the material. There are a wide variety of such semipolar planes, which can be defined as having both two nonzero h, i, or k Miller indices and a nonzero l Miller index. Families of such semipolar planes include {10-1l} and {11-2l}, for example, where l is a nonzero integer. Specific examples of commonly observed semipolar planes in GaN include {11-22}, {10-11}, and {10-13}. Other examples in the wurtzite crystal structure include, but are not limited to, {10-12}, {20-21}, and {11-21}, {10-14}. In a specific embodiment of the present invention wafers formed from the large-area bulk GaN wafer and subsequent growth have an orientation within 5 degrees of (10-11), (10-1-1), (10-12), (10-1-2), (10-13), (10-1-3), (11-21), (11-2-1), (20-21), (20-2-1), (10-14), (10-1-4), (11-22) or (11-2-2), along with their associated families of planes.

If desired for wafering or substrate applications which are commonly circular in shape, the resulting large-area bulk GaN wafer can be re-shaped to be approximately circular. The resultant re-shaped bulk GaN wafer would then be limited in size to a circle which is contained within the rhombus, as shown in FIG. 6a and FIG. 6b. According a specific embodiment and the method described herein, starting with a first seed structure with a diameter of ~2" will result in a bulk GaN wafer which is ~1" in diameter. A first seed structure with a diameter of ~8" will result in a bulk GaN wafer which is ~4". This method allows for fabrication of bulk GaN wafers with substantially larger area and substantially higher crystalline quality than are currently available.

In a one or more embodiments, the present wafer can be utilized to fabricate devices such as LEDs, lasers, transistors, and the like. In one embodiment the present wafer could be used to deposit an n-type gallium nitride layer, a quantum well active region layer or layers, and a p-type gallium nitride layer which comprise an LED device. It can be known from the literature that such a device or devices fabricated on the high-quality, low-dislocation-density, gallium nitride substrate will offer superior device performance. These devices can additionally be made in a cost-effective manner on the large-area wafer provided herein.

According to the methods described in Poblenz, Christiane, et al., U.S. Provisional No. 61/178,460 filed May 14, 2009, for fabrication of a GaN seed structure, and therefore in some embodiments of the present invention which incorporate at least a portion of such a seed structure, the sidewalls of the seed structure may be exposed. More particularly, one or more sidewall portions of the foreign substrate material which is sandwiched between the first and second sides of the seed structure (see FIG. 1) are exposed. Depending upon the characteristics of the substrate material utilized for fabrication of the seed structure, such substrate material may or may not be stable in ammonothermal growth environments, which can be acidic or basic in nature and at high temperatures and pressures. If it is not stable, to avoid decomposition of the exposed substrate sidewall area during ammonothermal growth, the sidewalls could be coated with an encapsulant coating or isolation region which is stable in the ammonothermal growth environment such as silver, gold, platinum, iridium, nickel, chromium, vanadium, among others or a combination thereof. A depiction of such an isolation region can be found in FIG. 2(a). For good adhesion to the exposed substrate, a thin layer of a reactive metal such as titanium could be used prior to the metal encapsulant deposition. In a specific embodiment, these metals could be deposited by techniques such as e-beam evaporation or sputtering.

According to a specific embodiment, the first seed structure is held in the growth environment by clips on one or more sides of the structure. In a specific embodiment, the sample could be held according to methods commonly known or suitable for large scale manufacturing. In other embodiments, the sample could be suspended in the growth environment. In this case it is possible that one or more holes would be drilled into the first seed structure in order to provide for the first seed structure to be suspended from a wire, for example. In this case the encapsulant deposition would also be preferred in order to provide an isolation region around exposed substrate sidewalls within one or more holes which have been formed in the seed structure prior to exposure to the growth environment.

In a specific embodiment, the formation of such an encapsulant layer or isolation region over exposed areas of foreign substrate material acts to prevent decomposition of the substrate material which also means it helps to prevent impurity incorporation into material which is subsequently grown. For example, decomposition of common substrates such as sapphire or SiC can result in incorporation of Al, O, Si or C, or a combination of these into a material in the growth environment. In a specific embodiment, the present invention provides a bulk gallium nitride wafer which has substantially low levels of impurities such as Al, O, Si and C. This is achieved in the first growth step by the presence of the isolation regions on the first seed structure as just described. Separating and using only lateral growth regions which do not contain foreign substrate material as second seed crystals for subsequent growth, as described herein, further ensures low levels of incorporation of such impurities in the resultant large-area gallium nitride wafer.

In another specific embodiment, the formation of the encapsulant layer or isolation region over the exposed areas of the foreign substrate material is neglected. This approach may be preferable since forming the isolation region may be a timely and/or expensive process. Accordingly, growth on the previously described seed structure without the formation of the encapsulant layer or isolation region may be pursued. Even if GaN material with high impurity incorporation is produced from the initial lateral growth from the seed structure without an encapsulant or isolation layer, this high impurity material may be subsequently used as a seed crystal for the growth of high-quality GaN with reduced impurity concentrations.

In one or more embodiments, the present invention provides an alternative method for producing the desired shape of the seed structure involving masking the gallium nitride substrate structure as follows:

1. Start;
2. Provide a seed structure having a first surface and a second surface;
3. Form a first thickness of first crystalline material and a second thickness of second crystalline material overlying the first surface and the second surface, respectively, of the seed structure;
4. Form a blocking region (e.g., mask) over substantially all or part of at least the first thickness of first crystalline material or the second thickness of second crystalline material to form one or more exposed regions of at least the first thickness of the first crystalline material or the second thickness of the second crystalline material;
5. Subject at least the exposed one or more regions to an ammonothermal process;
6. Cause formation of crystal material on the one or more exposed regions;
7. Continue formation of crystalline material;
8. Perform other steps, as desired; and
9. Stop.

The above sequence of steps provides a fabrication method for forming a large-area bulk gallium nitride containing wafer using a masking process according to an embodiment of the present invention, and is more particularly detailed below. In a specific embodiment, the present invention provides a method and device for forming a large-area bulk wafer containing at least one of Ga and N, In and N, or Al and N using a first seed structure which is substantially free of bowing or other imperfections. Other alternatives can also be provided where steps are added, one or more steps are removed, or one or more steps are provided in a different sequence without departing from the scope of the claims herein. Of course, there can be other variations, modifications, and alternatives.

In a specific embodiment, the present method provides a variety of different schemes to prepare the masked substrates. Included within this are a variety of mask deposition techniques and mask etching techniques of which are known in the art, and which may be utilized to prepare the masked substrates described in this invention. Examples of common patterning techniques include conventional photolithography, contact photolithography, stepper photolithography, shadow masking, among others, and combinations. Examples of common etching techniques include ion beam etching, reactive ion beam etching, inductively coupled plasma etching, chemically assisted ion beam etching, wet chemical etching, among others, and combinations. Some of the substrate preparation techniques are described below. Of course, there can be other variations, modifications, and alternatives.

Figure 7:
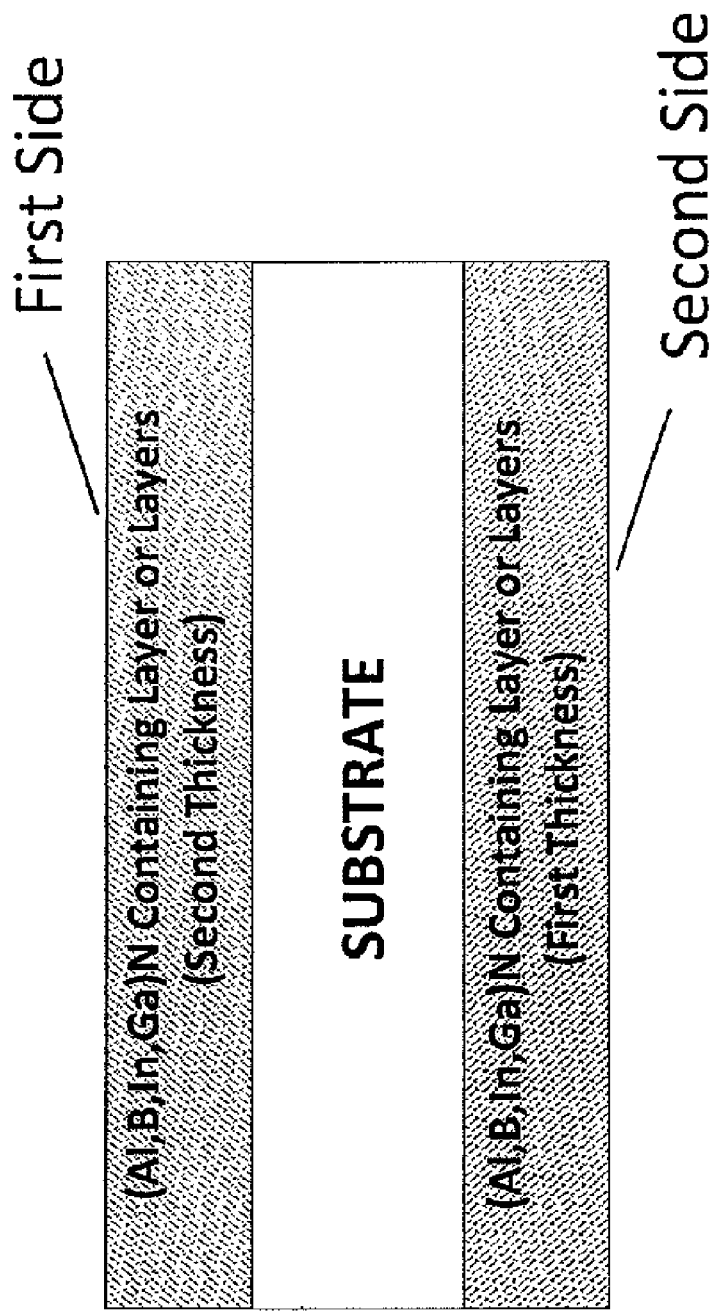
FIG. 7 is a simplified diagram of a cross-sectional view of a double-sided seed structure according to a specific embodiment.

FIG. 7 is a simplified diagram of a cross-sectional view of a double-sided seed structure. As shown, the substrate includes a first thickness and second thickness to form respective first side and second side. Each of the sides is configured to be free from bowing and/or other imperfections. Further details of the subsequent masking process are found throughout the present specification and more particularly below.

Figure 8:
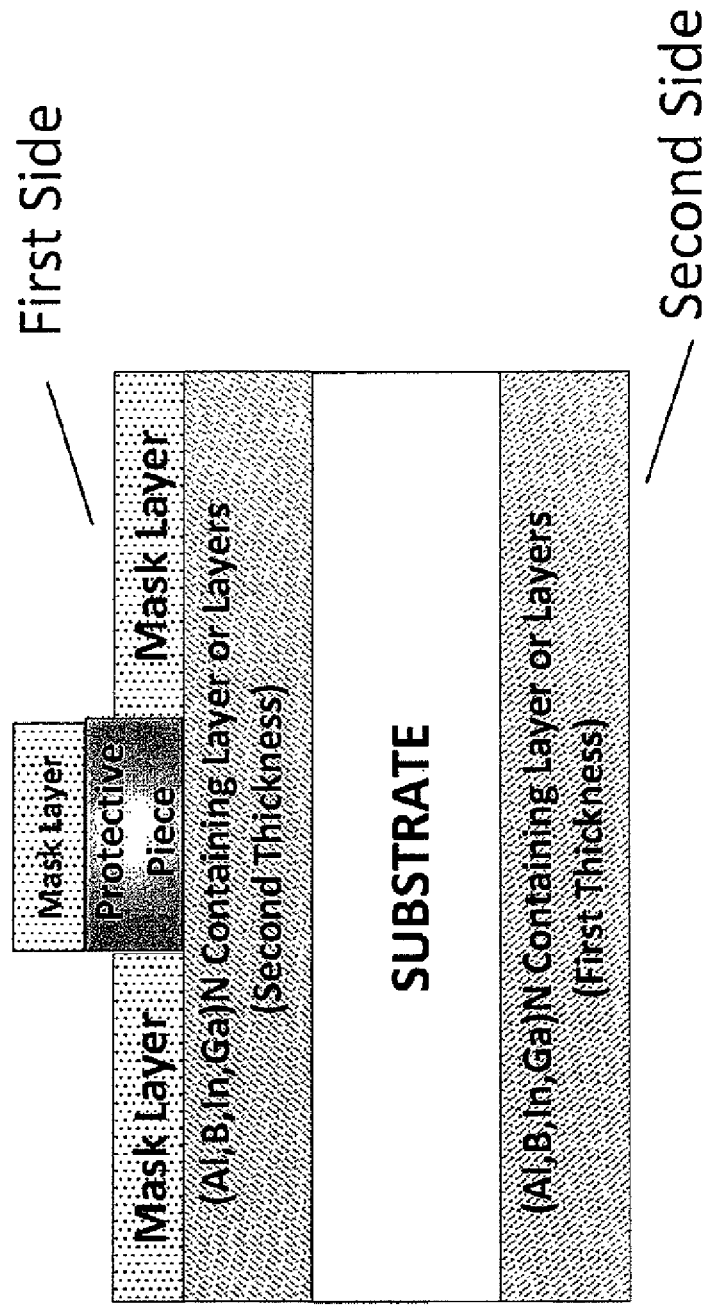
FIG. 8 is a simplified diagram of a cross-sectional view of a double-sided seed structure utilizing a protective piece to prevent deposition of a masking material in a select area according to a specific embodiment.

FIG. 8 is a simplified diagram of a cross-sectional view of a double-sided seed structure utilizing a protective piece to prevent deposition of a masking material in one or more select areas. Examples of masking materials include metals such as Ti, Ta, Mo, Ag, Au, W, Ni, Cr, Ir, V, or Pt, silicides or nitrides of these metals, or alloys containing these materials. In a specific embodiment, the protective piece may be in any shape and/or locations. The protective piece has only been shown on one side, but could optionally be used on the second side or both sides according to one or more embodiments. In a specific embodiment, the protective piece can include photoresist, sapphire, silicon, or silicon carbide including combinations, and the like. The protective piece could also be utilized in a process such as shadow masking, as is known within the art. Of course, there can be other variations, modifications, and alternatives.

Figure 9:
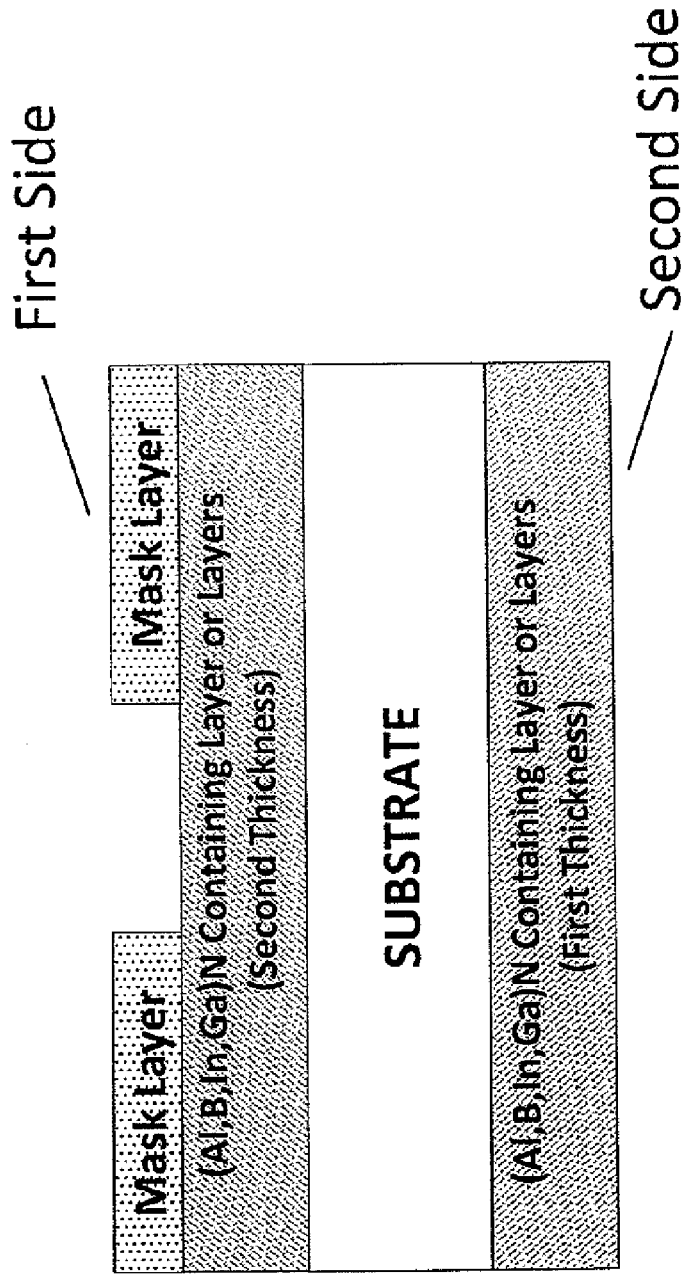
FIG. 9 is a simplified diagram of a cross-sectional view of a double-sided seed structure after removal of the protective piece, producing exposed (Al,B,In,Ga)N material on the first side of the substrate according to a specific embodiment.

FIG. 9 is a simplified diagram of a cross-sectional view of a double-sided seed structure after removal of the protective piece, producing exposed (Al,B,In,Ga)N material on the first side of the substrate. In a specific embodiment, the protective piece is removed using an etching technique such as wet etching or dry etching. In another embodiment, the protective piece is physically removed. In another embodiment, the substrate is removed in addition to or instead of moving the protective piece. Of course, there can be other variations, modifications, and alternatives.

Figure 10:
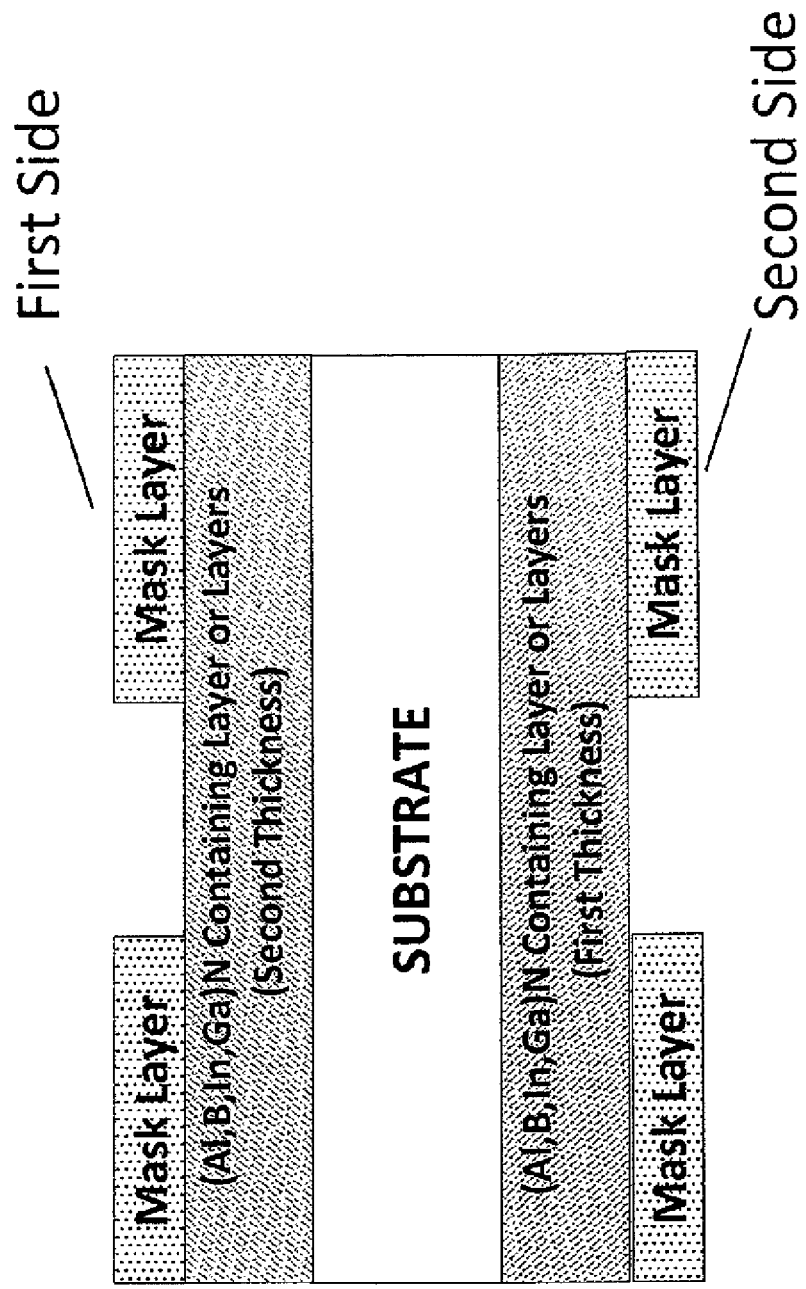
FIG. 10 is a simplified diagram of a cross-sectional view of a double-sided seed structure with exposed (Al,B,In,Ga)N material on both the first side and second side of the substrate according to a specific embodiment.

FIG. 10 is a simplified diagram of a cross-sectional view of a double-sided seed structure with exposed (Al,B,In,Ga)N material on both the first side and second side of the substrate.

This structure may be produced by the various masking processes, including those described within this document in the previous and following sections. Again, there can be other variations, modifications, and alternatives.

Figure 11:
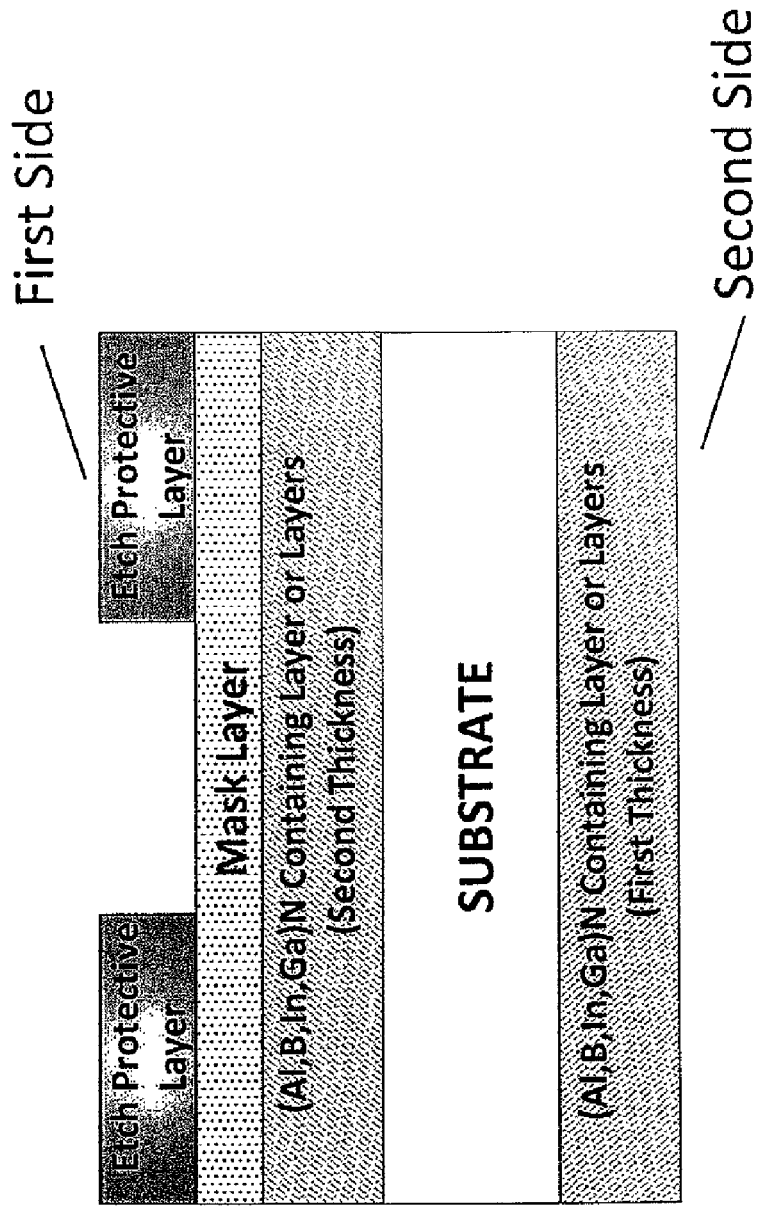
FIG. 11 is a simplified diagram of a cross-sectional view of a double-sided seed structure utilizing an etch protective layer over a mask layer according to a specific embodiment.

FIG. 11 is a simplified diagram of a cross-sectional view of a double-sided seed structure utilizing an etch protective layer over a mask layer. The mask layer and the etch protective layer have been shown on only the first side of the substrate, but could optionally be used on the second side, or both sides. In a specific embodiment, the etch protective layer can include metals such as Ti, Ta, Mo, Ag, Au, W, Ni, Cr, Ir, V, or Pt, silicides or nitrides of these metals, or alloys containing these materials, photoresist, SiN, $Si_3N_4$, $SiO_2$, TaO, among other suitable layers.

Figure 12:
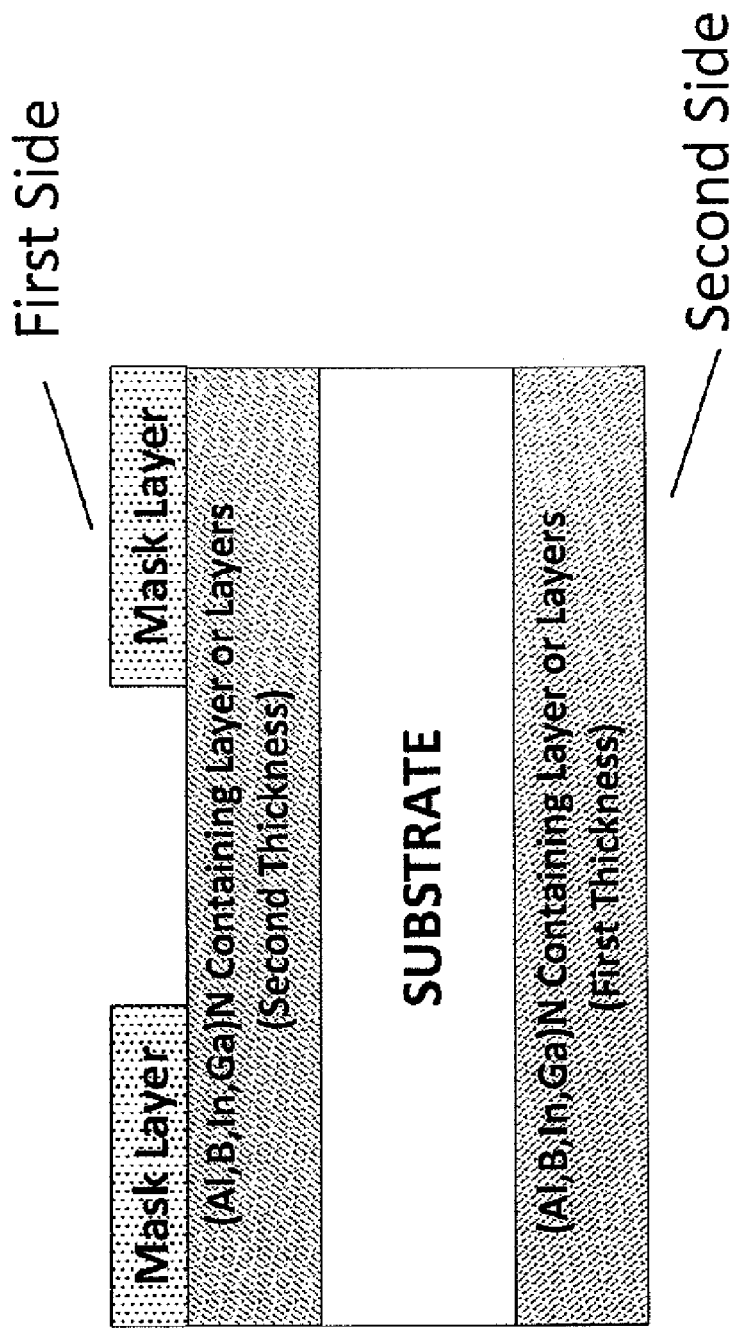
FIG. 12 is a simplified diagram of a cross-sectional view of a double-sided seed structure utilizing an etch protective layer over a mask layer according to a specific embodiment possessing a patterned mask layer after etching a portion of the mask material and removal of the etch protective layer. In a specific embodiment, the mask layer has been shown on only the first side of the substrate, but optionally could also be on the second side or both sides of the structure.

FIG. 12 is a simplified diagram of a cross-sectional view of a double-sided seed structure utilizing an etch protective layer over a mask layer according to a specific embodiment possessing a patterned mask layer after etching a portion of the mask material and removal of the etch protective layer. The patterned mask layer has been shown on only the first side of the substrate, but could optionally be used on the second side or both sides, as shown in FIG. 10. In a specific embodiment, the etch protective layer can include metals such as Ti, Ta, Mo, Ag, Au, W, Ni, Cr, Ir, V, or Pt, silicides or nitrides of these metals, or alloys containing these materials, photoresist, SiN, $Si_3N_4$, $SiO_2$, TaO, among other suitable layers. In a specific embodiment, the etch protective layer has been removed using ion beam etching, reactive ion beam etching, inductively coupled plasma etching, chemically assisted ion beam etching, wet chemical etching, or another suitable technique.

Figure 13:
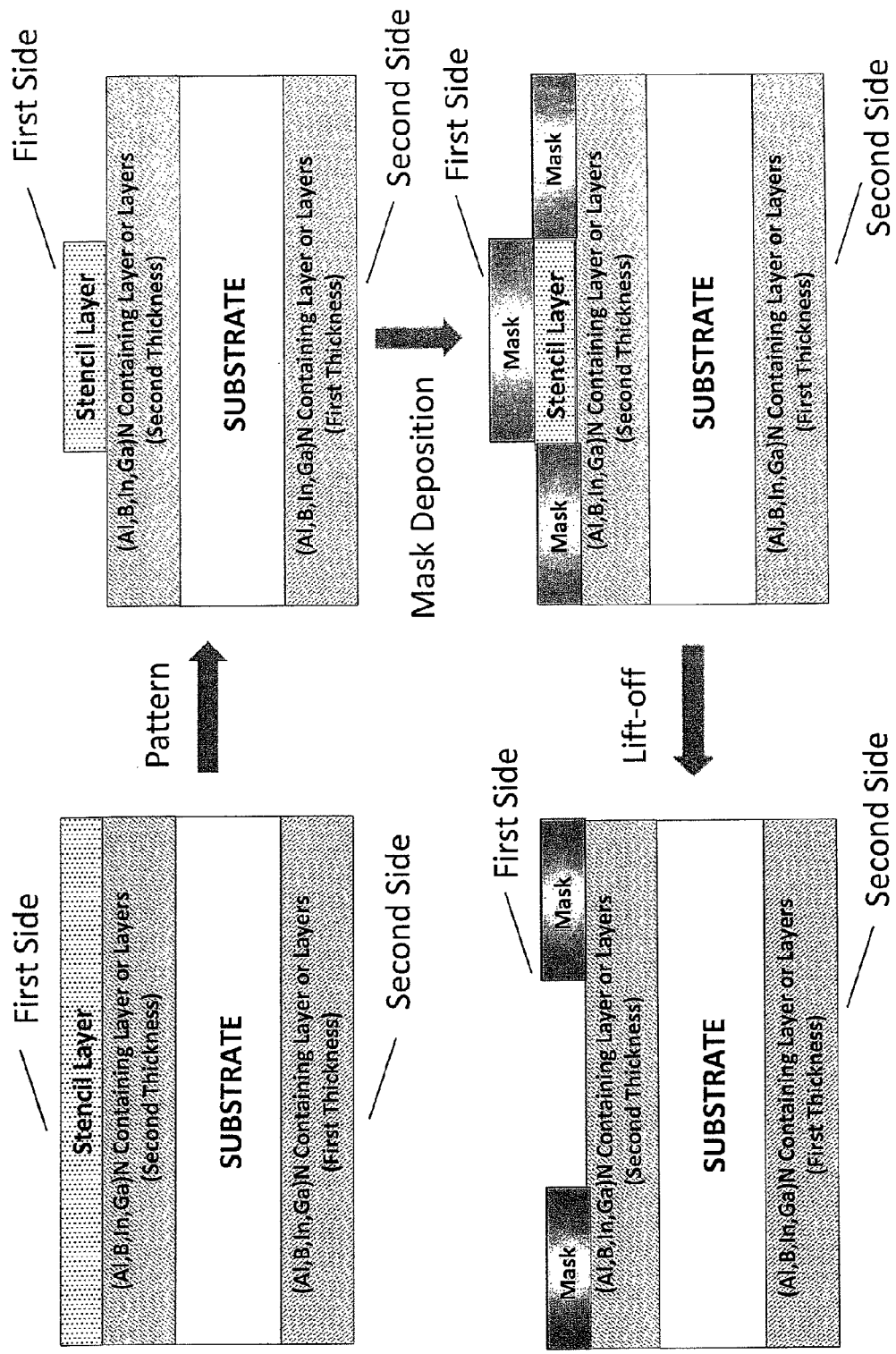
FIG. 13 is a simplified diagram of a cross-sectional view of a double-sided seed structure with a mask deposited on one side using a lift-off process according to a specific embodiment.

FIG. 13 is a simplified diagram of a cross-sectional view of a double-sided seed structure with a mask deposited on one side using a lift-off process. A stencil layer is first deposited and then patterned. In a specific embodiment, the stencil layer can be made of photoresist, which has been patterned as shown. The mask material is then deposited. In a specific embodiment, the mask material is suitably metals such as Ti, Ta, Mo, Ag, Au, W, Ni, Cr, Ir, V, or Pt, silicides or nitrides of these metals, or alloys containing these materials, among others. The stencil layer is then removed along with the mask material on top of it, producing a seed structure with a mask. This figure depicts a mask only on the first side of the substrate, but the second side could also contain a mask, or both sides. Of course, there can be other variations, modifications, and alternatives.

Figure 14:
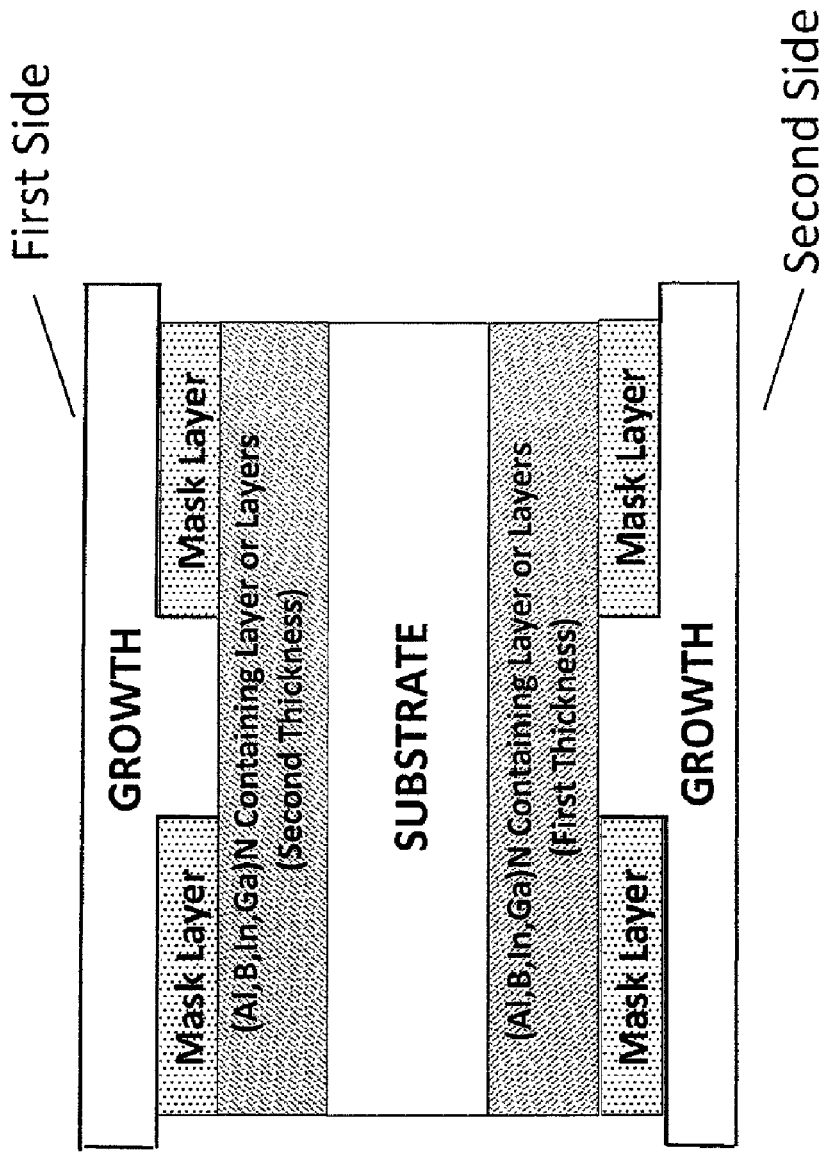
FIG. 14 is a simplified diagram of a cross-sectional view of a double-sided seed structure with growth and lateral overgrowth on both the first side and second side of a substrate that contains a mask according to a specific embodiment.

FIG. 14 is a simplified diagram of a cross-sectional view of a double-sided seed structure with growth and lateral overgrowth on both the first side and second side of a substrate that contains a mask. In a specific embodiment, the overgrowth is formed using a bulk growth process, for example the ammonothermal process, including acidic, neutral, and basic chemistry. Growth could also be performed using another bulk growth process, such as solution growth, melt growth, or another bulk growth technique. Preferably, the growth process is an ammonothermal process. Of course, there can be other variations, modifications, and alternatives.

As used herein, the term GaN substrate is associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k l) plane wherein h=k=0, and l is non-zero), non-polar GaN substrates (i.e., substrate material where the largest area surface is oriented at an angle ranging from about 80-100 degrees from the polar orientation described above towards an (h k l) plane wherein l=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above towards an (h k l) plane wherein l=0, and at least one of h and k is non-zero). Of course, there can be other variations, modifications, and alternatives.

While the above is a full description of the specific embodiments, various modifications, alternative constructions and equivalents may be used. Although the above has been described in terms of a specific embodiment, other techniques for providing the composite substrate or first seed structure can be found Poblenz, Christiane et al., and U.S. Provisional Pat. No. 61/178,460 filed May 14, 2009, commonly assigned, and hereby incorporated by reference herein. Therefore, the above description and illustrations should not be taken as limiting the scope of the present invention which is defined by the appended claims.

What is claimed is:

1. A method for fabricating crystalline material comprising:
   providing an seed structure substrate having a length x, a width y, and a thickness z, where x>y and x>z, the seed structure having a first surface on one side defined by length x and width y, and a second surface on an opposite side also defined by length x and width y;
   forming crystalline material on the first surface and on the second surface, thereby resulting in a an seed structure substrate having a layer of crystalline material approximately of length x and width y, and having thickness t overlying each the first surface and the second surface;
   forming laterally grown regions of the crystalline material of approximately thickness t, the laterally grown regions not overlying the seed structure substrate, and extending away from the seed structure in a direction parallel to the width y direction from the crystalline material; then
   removing at least a portion of the crystalline material to form a piece of crystalline material separate from the seed structure substrate.

2. The method of claim 1 wherein the seed structure substrate comprises a composite structure consisting of a crystalline substrate material sandwiched between two layers of crystalline material containing at least one of a gallium species and a nitrogen species; an aluminum species and a nitrogen species; or an indium species and a nitrogen species; the seed structure substrate being substantially free of bow or warp.

3. The method of claim 1 wherein each of the first surface and the second surface comprise one of a gallium species and a nitrogen species; an aluminum species and a nitrogen species; or an indium species and a nitrogen species.

4. The method of claim 1 wherein the seed structure substrate has a length of at least two inches.

5. The method of claim 1 wherein the first surface and the second surface of the seed structure substrate comprise a wurtzite crystal structure.

6. The method of claim 1 wherein the seed structure substrate is characterized by a surface crystallographic orientation within 10 degrees of (0001) or (000-1).

7. The method of claim 1 wherein the seed structure has a shape of a rectangular solid.

8. The method of claim 1 wherein the step removing at least a portion of the crystalline material comprises a step of at least one of etching, cleaving, dicing, sawing, laser scribing, or diamond scribing.

9. The method of claim 7 wherein the largest lateral dimension of the rectangular solid is characterized by being within 10 degrees of an a-plane (11-20) or m-plane (10-10) crystallographic orientation.

10. The method of claim 9 wherein the laterally grown regions of the crystalline material are in a (11-20) direction, a (10-10) direction, or a combination thereof.

11. The method of claim 1 wherein the step of forming laterally grown regions of the crystalline material comprises an ammonothermal process.

12. A method for fabricating crystalline material comprising:
providing a seed structure having a first surface and a second surface, the first surface and the second surface being composed of at least one of a gallium species and a nitrogen species, an aluminum species and a nitrogen species, or an indium species and a nitrogen species, the first surface overlying one side of an intermediary substrate and the second surface overlying another side of the intermediary substrate to form a composite structure, the composite structure being substantially free from bowing, the intermediary substrate being characterized by a diameter of at least two inches;
separating a composite region from the composite structure exposing one or more portions of the intermediary substrate and forming a first portion of the first surface and a second portion of the second surface;
forming at least an isolation region overlying the exposed one or more portions of the intermediary substrate to isolate the intermediary substrate from an exterior region;
forming a first thickness of first crystalline material overlying the first portion of the first surface and a second thickness of crystalline material overlying the second portion of the second surface, the first thickness of the first crystalline material and the second thickness of the second crystalline material being characterized by a first dislocation density;
causing formation of a first lateral growth region from either the first thickness or second thickness, the lateral growth region being characterized by a second dislocation, the second dislocation density being less than the first dislocation density; and
removing at least one seed crystal from one or more portions of at least the first lateral growth region, the seed crystal being characterized by having a portion that comprises the second dislocation density.

13. A method for fabricating crystalline material comprising:
providing an seed structure substrate having a length x, a width y, and a thickness z, where x>y and x>z, the seed structure having a first surface on one side defined by length x and width y, and a second surface on an opposite side also defined by length x and width y; the first surface and the second surface being provided by epitaxial layers of one of a gallium species and a nitrogen species; an aluminum species and a nitrogen species; or an indium species and a nitrogen species disposed on an underlying substrate;
forming isolation regions over surfaces of the underlying substrate and exposed portions of the epitaxial layers except for the first surface and the second surface;
forming a thickness t of crystalline material over the first surface and the second surface, the thickness t of crystalline material being characterized by a first dislocation density;
forming laterally grown regions of the crystalline material of approximately thickness t, the laterally grown regions not overlying the seed structure substrate, and extending away from the seed structure in a direction parallel to the width y direction from the crystalline material, the laterally grown regions being characterized by a second dislocation density which is less than the first dislocation density; and
removing from the laterally grown regions a seed crystal.

14. The method of claim 13 wherein the step of forming laterally grown regions comprises an ammonothermal process.

15. The method of claim 14 further comprising using the seed crystal to form a GaN substrate.

16. The method of claim 15 wherein the second dislocation density is less than $10^4$ per cm-2 and the GaN substrate has one dimension of at least two inches.

* * * * *